United States Patent [19]
Fujii et al.

[11] Patent Number: 5,434,513
[45] Date of Patent: Jul. 18, 1995

[54] SEMICONDUCTOR WAFER TESTING APPARATUS USING INTERMEDIATE SEMICONDUCTOR WAFER

[75] Inventors: Toshifumi Fujii; Masayoshi Koine, both of Kyoto, Japan

[73] Assignee: Rohm Co., Ltd., Kyoto, Japan

[21] Appl. No.: 323,054

[22] Filed: Oct. 14, 1994

Related U.S. Application Data

[63] Continuation of Ser. No. 56,659, May 3, 1993, abandoned.

[30] Foreign Application Priority Data

Aug. 10, 1992 [JP]  Japan .................................. 4-235258

[51] Int. Cl.⁶ .............................................. G01R 1/04
[52] U.S. Cl. ..................................... 324/765; 324/754
[58] Field of Search ........................ 324/73.1, 750–762

[56] References Cited

U.S. PATENT DOCUMENTS

| | | | |
|---|---|---|---|
| 4,038,599 | 7/1977 | Bove et al. | 324/754 |
| 5,034,685 | 6/1991 | Leedy | 324/158 F |
| 5,172,050 | 12/1992 | Swapp | 324/158 P |
| 5,177,438 | 1/1993 | Littlebury et al. | 324/158 P |

*Primary Examiner*—Kenneth A. Wieder
*Assistant Examiner*—Barry C. Bowser
*Attorney, Agent, or Firm*—Brumbaugh, Graves, Donohue & Raymond

[57] ABSTRACT

Bump electrodes are formed on the bottom surface of an intermediate semiconductor wafer at locations corresponding to electrode pads of circuit elements formed on a subject semiconductor wafer. Pickup electrodes and control electrodes are formed on the top surface of the intermediate semiconductor wafer. A switching circuit is formed in the intermediate semiconductor wafer, and serves to connect selected ones of the bump electrodes to the pickup electrodes in accordance with switching control signals provided from a tester via the control electrodes. The pickup electrodes and the control electrodes are connected to the tester via pogo pins.

7 Claims, 2 Drawing Sheets

SEMICONDUCTOR WAFER TESTING APPARATUS USING INTERMEDIATE SEMICONDUCTOR WAFER

This application is a continuation of application Ser. No. 08/056,659, filed on May 3, 1993, now abandoned.

BACKGROUND OF THE INVENTION

The present invention relates to an apparatus of testing electrical characteristics of a large number of circuit elements formed on a semiconductor wafer.

In semiconductor device manufacturing processes, a testing apparatus called "wafer prober" is generally used as the above type of testing apparatus. Referring to FIG. 2, this conventional testing apparatus is described below.

In FIG. 2, an index table 1 for supporting, with suction, a subject semiconductor wafer W is capable of horizontal movement in two orthogonal directions (X- and Y-directions), rotational movement about the vertical axis ($\theta$-direction), and vertical movement at predetermined strokes. A probe card 2 is disposed over the index table 1, and a plurality of radially arranged probe needles 3 made of an elastic metal material such as tungsten are attached to the bottom surface of the probe card 2 so as to be located under its central area. The tip portions of the probe needles 3 are arranged so as to correspond to respective electrode pads of a circuit element (one chip) formed on the semiconductor wafer W. The respective probe needles are electrically connected to an electrical characteristics measuring device (tester; not shown).

In testing the electrical characteristics of the individual circuit elements of the semiconductor wafer W using the wafer prober thus constructed, the index table 1 is moved in the X-, Y- and $\theta$-directions to position the semiconductor wafer W with respect to the probe card 2 so that the probe needles 3 are opposed to the respective electrode pads of the first circuit element. After the index table 1 is moved upward to make the probe needles 3 in pressure contact with the respective electrode pads of the circuit element, the electrical characteristics of the first circuit element are tested. As shown in FIG. 3, a plurality of circuit elements are tested one by one starting with the one located at the end portion of the semiconductor wafer W while the index table 1 is fed in the X- and Y-directions at a pitch equal to the arrangement pitch of the circuit elements.

However, the above-described conventional apparatus has the following problems. Since a large number of circuit elements formed on the semiconductor wafer W are tested one by one, it is necessary to pitch-feed the index table 1. Therefore, even if the measurement itself by the tester is performed in a short period, a considerable time is required to pitch-feed the index table 1, which results in an increase of the total test time of all the circuit elements of the semiconductor wafer W, therefore, the efficiency of the test process is low.

SUMMARY OF THE INVENTION

An object of the present invention is to provide an apparatus which can efficiently test the electrical characteristics of a semiconductor wafer.

An apparatus for testing electrical characteristics of a plurality of circuit elements formed on a subject semiconductor wafer, comprises:

an intermediate member;

a plurality of bump electrodes formed on a first surface of the intermediate member to be faced with the subject semiconductor wafer at locations corresponding to respective electrode pads of the circuit elements formed on the subject semiconductor wafer;

a plurality of pickup electrodes formed on a second surface of the intermediate member and electrically connected to the bump electrodes; and a connection mechanism for connecting the pickup electrodes to an electric characteristics measuring device.

The bump electrodes are made in pressure contact with the respective electrode pads of the circuit elements of the subject semiconductor wafer. Measurement electrical signals are provided from the electrical characteristics measuring device to the circuit elements via the connection mechanism, pickup electrodes and bump electrodes. Response signals are output from certain electrode pads of the circuit elements, and sent to the measuring device via the bump electrodes, pickup electrodes and connection mechanism. Thus, the electrical characteristics of the circuit elements are tested at once.

DESCRIPTION OF THE PREFERRED EMBODIMENTS

Figure 1:
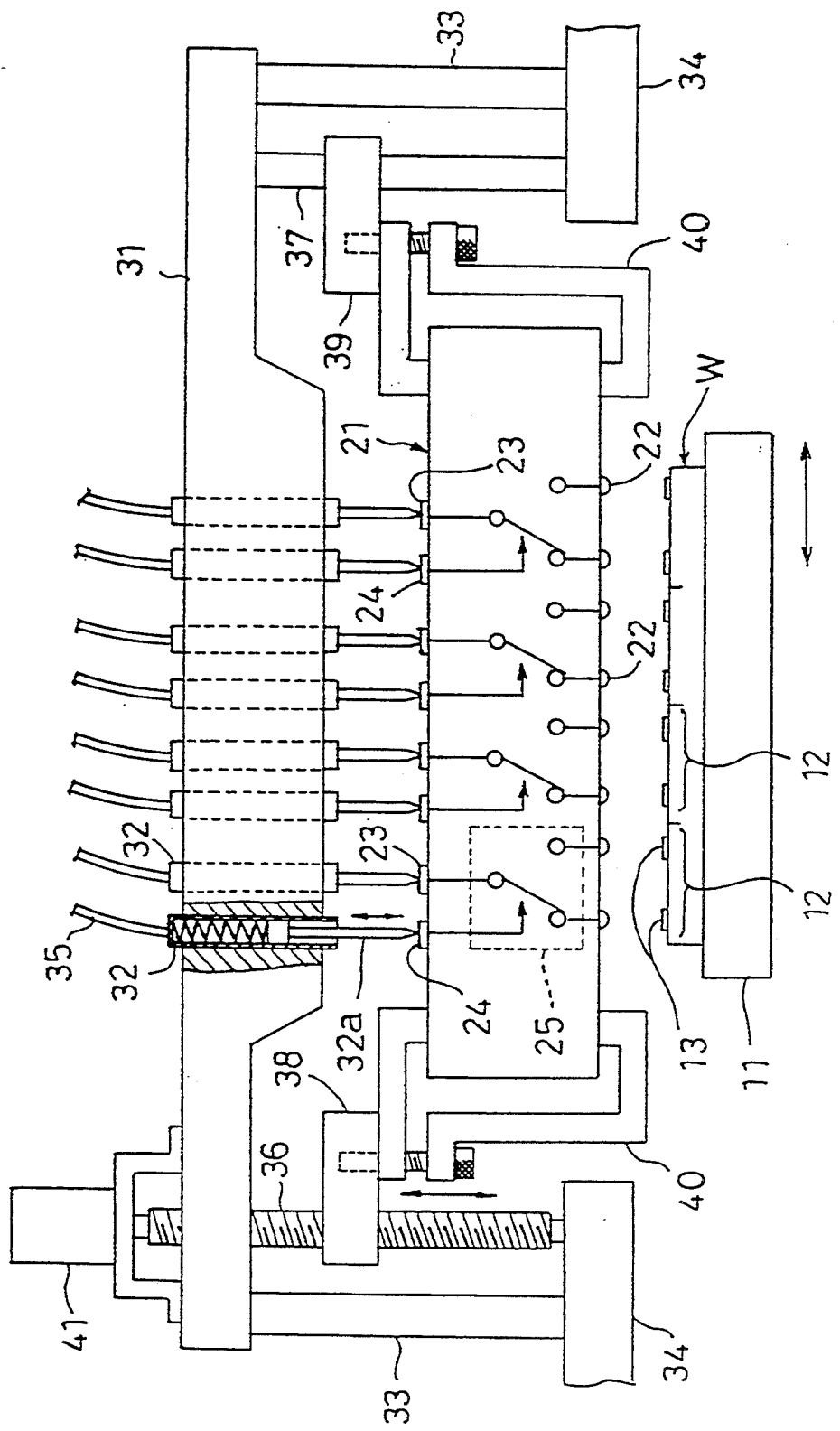
FIG. 1 schematically shows a semiconductor wafer testing apparatus according to an embodiment of the present invention.
Figure 2:
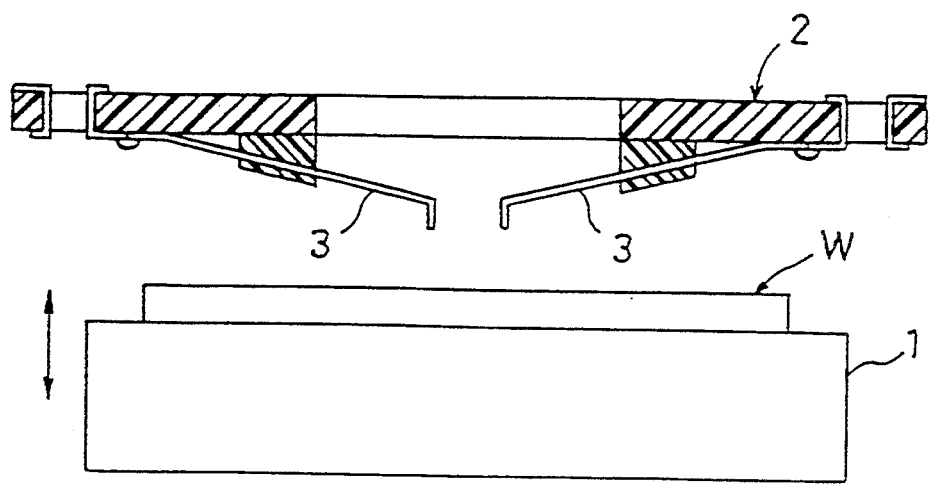
FIG. 2 shows a conventional semiconductor wafer testing apparatus.
Figure 3:
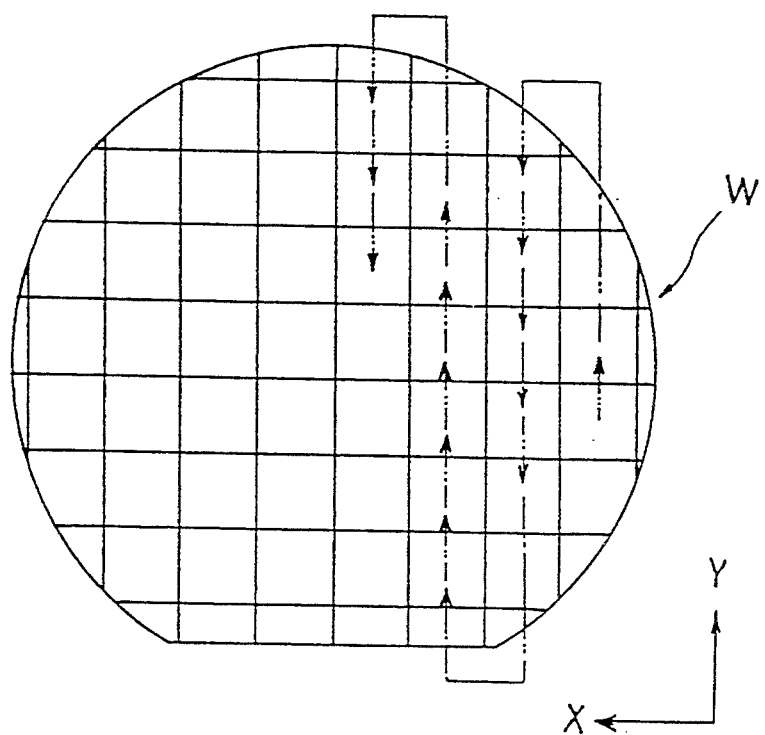
FIG. 3 illustrates a measurement sequence of the conventional testing apparatus.

FIG. 1 schematically shows a semiconductor wafer testing apparatus according to an embodiment of the present invention. A table 11 for supporting, with suction, a subject semiconductor wafer W is constructed so as to be movable horizontally. A large number of circuit elements 12, each having a group of electrode pads 13, are formed on the semiconductor wafer W.

A semiconductor wafer (intermediate semiconductor wafer) 21 for the testing apparatus has, on its bottom surface, a large number of bump electrodes 22 that are arranged in the same positional relationship as of the electrode pads 13 of the circuit elements 12 of the semiconductor wafer W. The bump electrodes 22 are made of an alloy including, e.g., Au, Ag, Cu, Ni and Si, and are about 50 $\mu$m in diameter and about 25 $\mu$m in height. If the height of the bump electrodes 22 has a large variation, it is not assured that all the bump electrodes 22 are properly contacted with the corresponding electrode pads 13. Therefore, it is preferable that the variation of the height of the bump electrodes be controlled to be approximately within the range of $\pm 2$ $\mu$m.

Pickup electrodes 23 and control electrodes 24 are formed on the top surface of the semiconductor wafer 21. A switching circuit 25 capable of connecting the pickup electrodes 23 to arbitrarily selected ones of the bump electrodes 22 is formed in the semiconductor wafer 21. The switching circuit 25 is drawn in FIG. 1 in the form of an equivalent circuit, and it is apparent that the switching circuit 25 consists of solid-state circuit elements formed by known techniques including impurity diffusion. The control electrodes 24 serve to provide control signals to the switching circuit 25.

The switching circuit 25 of the semiconductor wafer 21 is so constructed as to switch the electrode pads 13 of the several tens of circuit elements (chips) 12 formed on the subject semiconductor wafer W such that the electrode pads 13 of the circuit elements 12 are selected in a matrix form. The switching circuit 25 may be constructed so as to effect a selection among part of the electrode pads 13 (in an input portion, output portion, etc.) in a single circuit element 12 which part relate to the same kind of signals.

A large number of pogo pins 32 (connection mechanism) are held by a plate 31, which is supported by a base 34 via a stay 33. A connection pin 32a is inserted in each pogo pin 32 so as to be urged downward and movable in its axial direction. The tips of the respective connection pins 32a are made in pressure contact with the pickup electrodes 23 or control electrodes 24 formed on the semiconductor wafer 21 to provide electrical connections. The pogo pins are electrically connected to an electrical characteristics measuring apparatus (tester; not shown) via respective cables 35.

A pair of threaded axes 36 and a pair of guide axes 37 are disposed diagonally between the plate 31 and the base 34. (FIG. 1 shows only one threaded axis 36 and one guide axis 37.) A movable member 38 is threadedly engaged with the axis 36, and another movable member 39 is movably fitted with the guide axis 37. The semiconductor wafer 21 for the testing apparatus is supported by the movable members 38 and 39 via clamp mechanisms 40. One ends of a pair of threaded axes 36 are respectively connected to a pair of motors 41 that are provided on the top surface of the plate 31. (FIG. 1 shows only one motor 41.) The two motors 41 are synchronously driven to rotate the respective threaded axes 36 to allow the semiconductor wafer 21 to ascend or descend while kept horizontal.

The operation of the above testing apparatus is described below.

After the subject semiconductor wafer W is supported by the table 11 at a setting position (not shown) with suction, the table 11 is moved to an alignment position (not shown). At the alignment position, the positional deviation of the semiconductor wafer W is detected, for instance, by optically detecting monitor pads formed on the semiconductor wafer W and performing a pattern recognizing operation. The semiconductor wafer W is properly positioned by moving the table 11 in the X-, Y- and $\theta$-directions in accordance with the deviation thus detected.

After the positioning of the semiconductor wafer W, the table 11 is moved until reaching the predetermined position under the semiconductor wafer 21 for the testing apparatus. Then, the motors 41 are normally driven to lower the semiconductor wafer 21 by a predetermined length to make the bump electrodes 22 of the semiconductor wafer 21 in pressure contact with the respective electrode pads 13 of the subject semiconductor wafer W. Since the connection pins 32a also descend in accordance with the descent of the semiconductor wafer 21, the electrical connections between the connection pins 32a and the pickup electrodes 23 or the control electrodes 24 are kept continuously.

In this state, electrical signals for measurement are provided from the tester (not shown) to the electrode pads 13 of the semiconductor wafer W via the cables 35, pogo pins 32, pickup electrodes 23, switching circuit 25 and bump electrodes 22. In response to the signals for measurement, response signals are output from certain electrodes pads 13 and sent via the bump electrodes 22, switch circuit 25, pickup electrodes 23, pogo pins 32 and cables 35 to the tester, which evaluates the electrical characteristics of the semiconductor wafer W. The above operation is performed while sequentially selecting desired ones of the electrode pads 13 by switching the contacts of the switching circuit 25 in accordance with control signals that are applied from the tester to the switching circuit 25 via the control electrodes 24.

According to the above embodiment, the electrical characteristics of a large number of circuit elements of the subject semiconductor wafer W are tested at once. Therefore, unlike the case of the conventional apparatus, it is not necessary to pitch-feed the table 11, which will greatly improve the efficiency of the test process.

Although in the above embodiment the semiconductor wafer 21 for the test apparatus is raised or lowered by the threaded feeding mechanism, it may be raised or lowered by an actuator such as an air cylinder. Further, the table 11 supporting the semiconductor wafer W may be raised or lowered by necessary strokes with the semiconductor wafer 21 fixed.

Although in the above embodiment the semiconductor wafer 21 for the testing apparatus is so constructed as to allow all the circuit elements 12 of the semiconductor wafer W to be tested at once, the invention is not limited to such a case. The semiconductor wafer 21 may be so constructed as to allow a plurality of, i.e., not all, circuit elements 12 of the semiconductor wafer W to be tested at once. In this case, after one group of circuit elements 12 are tested at once, the table 11 is moved horizontally by necessary pitches and the next group of circuit elements 12 are tested at once. Even this type of testing apparatus can improve the efficiency of the test process compared with the conventional case.

In addition to the switching circuit 25, an amplification circuit for amplifying the response signals received by the bump electrodes 22 may be formed on (or in) the semiconductor wafer 21 by the known diffusion technique. According to the invention, since the bump electrodes 22 for electrical connections to the electrode pads 13 are formed on the semiconductor wafer 21, any circuit necessary for the test can be incorporated into the semiconductor wafer 21.

As described above, according to the invention, the electrical characteristics of a plurality of circuit elements of a subject semiconductor wafer can be tested at once. Therefore, unlike the conventional case, it is not necessary to pitch-feed the subject semiconductor wafer on a single circuit element basis. Therefore, the electrical characteristics of the individual circuit elements of the semiconductor wafer can be tested more efficiently.

In particular, by virtue of the provision of the switching circuit, the number of pickup electrodes can be reduced to a number much less than the number of bump electrodes, to simplify the mechanism for connecting the pickup electrodes to the tester.

What is claimed is:

1. An apparatus for testing electrical characteristics of a plurality of separate, individual circuit elements formed on a subject semiconductor wafer, comprising:
   an intermediate member;
   a plurality of sets of bump electrodes formed on a first surface of the intermediate member to be faced with the subject semiconductor wafer at locations corresponding to respective sets of electrode pads of each of the plurality of the separate, individual circuit elements formed on the subject semiconductor wafer;

a plurality of pickup electrodes formed on a second surface of the intermediate member and electrically connected to the bump electrodes;

switching means in the intermediate member for selectively switching at least one of the plurality of pickup electrodes to selected bump electrodes corresponding to different ones of the plurality of separate, individual circuit elements; and a connection mechanism for connecting the pickup electrodes to an electrical characteristics measuring device.

2. The apparatus of claim 1, wherein the intermediate member is an intermediate semiconductor wafer different from the subject semiconductor wafer, said switching means comprising a switching circuit formed in the intermediate semiconductor wafer, for connecting selected ones of the bump electrodes to the pickup electrodes.

3. The apparatus of claim 2, further comprising a plurality of control electrodes formed on the second surface of the intermediate semiconductor wafer, for providing switching control signals to the switching circuit, wherein the connection mechanism further connects the control electrodes to the electrical characteristics measuring device to allow the control signals to be provided from the electrical characteristics measuring device to the control electrodes.

4. The apparatus of claim 2, further comprising an amplification circuit formed on or in the intermediate semiconductor wafer, for amplifying response signals output from the circuit elements.

5. The apparatus of claim 1, further comprising means for moving the intermediate member toward and away from the subject semiconductor wafer.

6. An apparatus for testing electrical characteristics of a plurality of individual circuit elements formed on a subject semiconductor wafer, comprising:

an intermediate member;

a plurality of sets of bump electrodes formed on a first surface of the intermediate member to be faced with the subject semiconductor wafer at locations corresponding to respective sets of electrode pads of plurality of the individual circuit elements formed on the subject semiconductor wafer;

a plurality of pickup electrodes formed on a second surface of the intermediate member and electrically connected to the bump electrodes; and a connection mechanism for connecting the pickup electrodes to an electrical characteristics measuring device, and further comprising means for maintaining electrical connections between the pickup electrodes and the electrical characteristics measuring device while the intermediate member is moved toward or away from the subject semiconductor device.

7. The apparatus of claim 6, wherein the maintaining means comprises a plurality of pogo pins and connection pins movably fitted in the respective pogo pins.

* * * * *

UNITED STATES PATENT AND TRADEMARK OFFICE
CERTIFICATE OF CORRECTION

PATENT NO. : 5,434,513
DATED : July 18, 1995
INVENTOR(S) : Toshifumi Fujii et al.

It is certified that error appears in the above-indentified patent and that said Letters Patent is hereby corrected as shown below:

Column 2, line 16, "provided" should read --provided at once--;

Column 6, line 15, "of plurality" should read --of the plurality--;

Signed and Sealed this

Twenty-seventh Day of February, 1996

Attest:

BRUCE LEHMAN

Attesting Officer          Commissioner of Patents and Trademarks